United States Patent [19]

Itani et al.

[11] Patent Number: 5,113,402
[45] Date of Patent: May 12, 1992

[54] SOLID STATE LASER DEVICE FOR LITHOGRAPHY LIGHT SOURCE AND SEMICONDUCTOR LITHOGRAPHY METHOD

[75] Inventors: Akira Itani; Kazuo Shimazaki, both of Chiyoda, Japan

[73] Assignee: Mitsui Petrochemical Industries, Ltd., Tokyo, Japan

[21] Appl. No.: 585,925

[22] Filed: Sep. 21, 1990

[30] Foreign Application Priority Data

Sep. 21, 1989 [JP] Japan ................. 1-245860

[51] Int. Cl.⁵ ............................. H01S 3/10
[52] U.S. Cl. ........................ 372/22; 372/20; 372/21
[58] Field of Search .............. 372/20, 21, 22; 307/425, 427; 606/2, 3

[56] References Cited

U.S. PATENT DOCUMENTS

| | | | |
|---|---|---|---|
| 4,272,694 | 6/1981 | Jacobs | 307/427 |
| 4,346,314 | 8/1982 | Craxton | 307/427 |
| 4,599,727 | 7/1986 | Jenssen | 372/41 |
| 4,791,927 | 12/1988 | Menger | 606/3 |
| 4,873,692 | 10/1989 | Johnson et al. | 372/20 |

FOREIGN PATENT DOCUMENTS 62-162376 7/1987 Japan.

Primary Examiner—Georgia Y. Epps
Attorney, Agent, or Firm—Sherman and Shalloway

[57] ABSTRACT

A non-linear optical material is used to convert a solid state laser ray of light output of a first wavelength into light of a shorter wavelength. The light output of shorter wavelength is suitable for use as a light source for lithography. Wavelengths as short as those obtained by excimer laser devices can be achieved. When the light source is used in lithography, the degree of integration of ICs for the new generation of 16MDRAM can be achieved more safely and simply than possible with excimer lasers.

9 Claims, 1 Drawing Sheet a
SOLID STATE LASER DEVICE FOR LITHOGRAPHY LIGHT SOURCE AND SEMICONDUCTOR LITHOGRAPHY METHOD

BACKGROUND OF THE INVENTION

The present invention relates to a solid state laser device for a lithography light source and a semiconductor lithography method.

As a high degree of integration of ICs is increasing and manufacturing processes for ICs become complicated, a technological miracle is required for manufacturing a semiconductor device. The industries of semiconductor manufacturing devices are engaged in technical developments which see into the situation after 64 MDRAM as well as 16 megabit dynamic RAM (Hereinafter, it is called as MDRAM: Random Access Memory which needs storage holding operation.)

As semiconductor manufacturing devices, there are available an exposure device, an ion implantation device, an etching device, a CVD (Chemical Vapor Deposition) device, a sputterring device, an inspection device, an assembly device, and the like. Among them, it is a stepper (a successively moving type compact exposure device) that relates to the degree of integration of ICs and attracts attention. This is a device which prints patterns of electric circuits on a silicon wafer using a ray of light. How such fine lines can be drawn by the stepper is to directly determine the degree of integration of a memory and the like.

The lithography technology is a basic one for fineness of such a semiconductor device. Efforts for fineness are being promoted by various lithography technologies such as electron beam exposure, X-ray exposure, ion beam exposure, and the like, including light exposure.

Though the light source for lithography which is used as a leading one at present is a G ray (436 nm) of an extra-high voltage mercury lamp, a type using an I ray (365 nm) is announced. Further, a plan which copes with microscopic working in the future by use of a KrF excimer laser (wavelength is 248 nm) type stepper as light exposure is in progress.

When using the G ray (436 nm) and the I ray (365 nm), the degree of integration of ICs is limited by the restriction of the wavelength of the light source, and it is considered that the degree of integration up to 16 MDRAM is a limit. In order to further enhance the degree of integration, a short-wavelength excimer laser is nominated for the light source in the next generation, and research and development on it are promoted.

There are a lot of defective points when an excimer is introduced in its manufacturing line. Fluorine gas which has not been used in a conventional manufacturing plant is introduced. Since fluorine gas is a fairly dangerous gas, sufficient safety measures for gas piping materials, a piping system, and the like are required.

In addition, gas equipments are necessary as a peripheral device and it is considered that anti-dust and anti-noise measures (gas circulation equipment) are necessary while the device is made large-sized and the place for its installation is limited.

SUMMARY OF THE INVENTION

The present invention is devised in consideration of the above-mentioned actual state of affairs, and its object is to materialize a compact solid state laser of the same short wavelength as that of an excimer laser as a lithography light source.

The present invention relates to a solid state laser device characterized in that it is provided with a solid state laser and nonlinear optical materials which convert a solid state laser ray of light output from the solid state laser in wavelength into a ray of light of a short wavelength to employ the solid state laser as a light source for lithography. Also, the present invention relates to a semiconductor lithography method characterized in that a wavelength of a laser ray of light output from a solid state laser is made short by conversion of its wavelength using nonlinear optical materials, and semiconductor circuit patterns are drawn by the laser ray of light of the short wavelength.

When the present invention is employed, a lithography light source which copes with the degree of integration of ICs more than the 16 MDRAM and is suitable for IC manufacturing processes can be obtained by a solid state laser which is safe and simple in constitution compared with an excimer laser, thereby allowing accurate semiconductor circuit patterns to be formed.

DESCRIPTION OF PREFERRED EMBODIMENT

Figure 1:
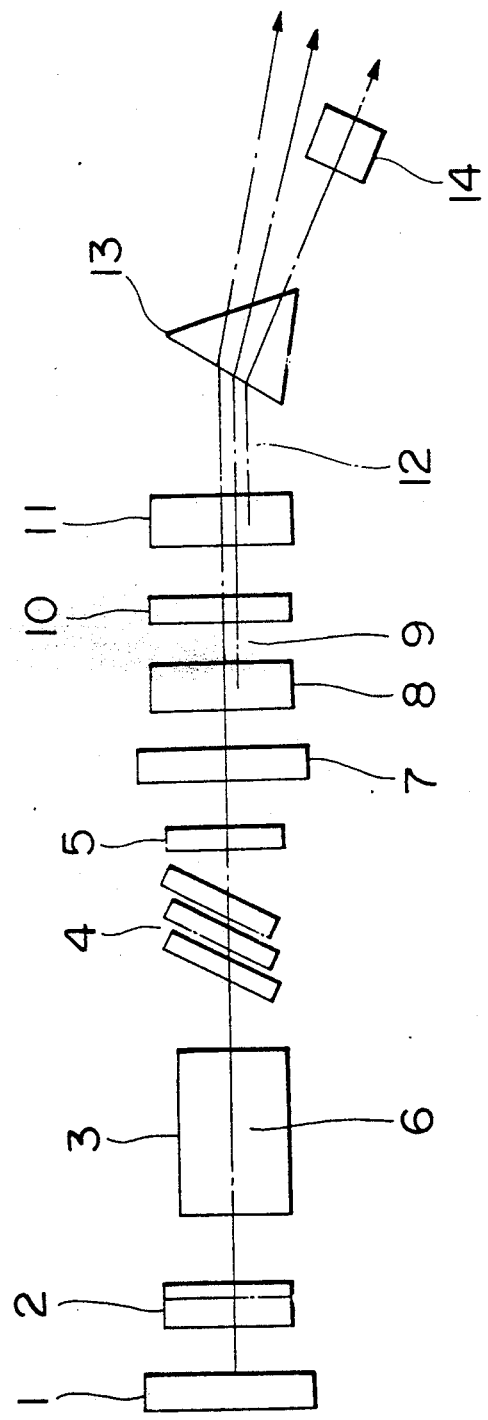
FIG. 1 is a schematic explanatory diagram showing an embodiment of a laser device for lithography according to the present invention.

Various kinds of solid state lasers can be employed as the solid state laser used in the present invention as follows. For example, a YAG laser, a ruby laser ($Cr^{3+}$: $Al_2O_3$ [$Cr^{3+}$ is replaced by Al in a host crystal as an active substance], a glass laser, an alexandrite laser ($Cr^{3+}$: $BeAl_2O_4$), a garnet laser ($Cr^{3+}$: $Y_3Ga_5O_{12}$, $Cr^{3+}$: $Gd_3Ga_5O_{12}$, $Cr^{3+}$: $Y_3Sc_2Ga_3O_{12}$, $Cr^{3+}$: $Gd_3Sc_2Ca_3O_{12}$, $Cr^{3+}$: $Gd_3Sc_2Al_3O_{12}$, $Cr^{3+}$: $La_3Lu_2Ga_3O_{12}$), a sapphire laser ($Ti^{3+}$: $Al_2O_3$), and the like. Also, an oscillation ray of light of 308 nm to 325 nm can be obtained by a YLF laser using $Ce^{3+}$ as an active substance.

Here, the alexandrite laser, the garnet laser, the sapphire laser, and the like all of which have a certain band in their oscillation wavelengths can be used as laser medium of solid state lasers of a variable wavelength. The solid state laser of the variable wavelength can be also used as the solid state laser according to the present invention.

Hence, the solid state laser of the variable wavelength is provided with a laser medium that is a solid having a laser transition of a wide energy bandwidth, a resonator having a sufficiently wide wavelength range, and an element which tunes the oscillation wavelength. In some case, a combined wavelength tuning element and resonator which has a wavelength selectivity is employed. A semiconductor laser used as another solid state laser of a variable wavelength can be illustrated.

The use of a solid state laser of a variable wavelength is effective in that an optimum wavelength can be obtained.

Variable wavelengths laser rays of light output from these solid state lasers are substantially in the range of 680 to 2500 nm as shown in Table 1 below. Among them, the wavelengths in the range of 680 to 1200 nm are effectively employed.

TABLE 1

| Ion | Host crystal | Oscillation wavelength (nm) |
| --- | --- | --- |
| $d^1$ $Ti^{3+}$ | $Al_2O_3$ (Sapphire) | 680 to 1178 |
| | $BeAl_2O_4$ (Chrysoberyl) | 750 to 950 |
| $d^2$ $V^{2+}$ | $MgF_2$ | 1050 to 1300 |
| $d^3$ $Cr^{3+}$ | $BeAl_2O_4$ (Alexandrite) | 701 to 818 |
| | $Be_3Al_2Si_6O_{12}$ (Emerald) | 720 to 842 |
| | $Mg_2SiO_4$ (Forsterite) | 1100 to 1340 |
| | $Gd_3Sc_2Ga_3O_{12}$ | 742 to 842 |
| | $Gd_3Sc_2Al_3O_{12}$ | 740 to 820 |
| | $KZnF_3$ | 785 to 865 |
| | $ZnWO_4$ | 980 to 1090 |
| | $ScBO_3$ | 787 to 891 |
| $d^7$ $Co^{2+}$ | $MgF_2$ | 1630 to 2450 |
| | $KMgF_3$ | 1650 to 2070 |
| $d^8$ $Ni^{2+}$ | $MgF_2$ | 1500 to 2500 |
| YAG laser | | 1064 |
| Ruby laser | | 698 |
| Glass laser | | 1060 |

A laser ray of light output from a solid state laser is converted in wavelength into a laser ray of light of a short wavelength, for example, one of 160 to 600 nm, and one of 200 to 300 nm in the preferably range by nonlinear optical materials.

As nonlinear optical materials, both inorganic and organic materials can be employed. As inorganic materials, there are available nonlinear optical crystals exemplified by such as a single crystal of $\beta$-type barium borate ($\beta$-$BaB_2O_4$), a single crystal of $KH_2PO_4$, a single crystal of $KB_5O_4 \cdot 4H_2O$, $KD_2PO_4$, $LiB_3O_5$, $KTiOPO_4$, $LiIO_3$, $KNbO_3$, $NH_4H_2PO_4$, $R_bH_2AsO_4$, $CsH_2AsO_4$, $R_bH_2PO_4$, $CsD_2AsO_4$, $LiNbO_3$, and $Ba_2NaNb_5O_{15}$, and there are preferably $\beta$-$BaB_2O_4$ and $KTiOPO_4$. Each of these crystals has an incident plane of a laser ray of light at least in a spherical state, and its surface is parallel with its XZ plane and spherical in such a manner that an angle which is made between the XZ plane and the Z-axis involve a phase matching angle in conversion of the wavelength of the laser ray of light.

Also, as nonlinear optical organic materials, there can be exemplified UREA, d-LAP {$(D_2N_2)^{30}$ $_2$CND $(CH_2)_3CH(ND_3)+COO^-D_2PO_4^-D_2O$}, MNA (2-methyl-4 nitroaniline), MAP {methyl-(2,4-dinitrophenyl)-amino-2-propanate}, POM (3-methyl-4-nitropyridine)-1-oxide), and mNA (meta-nitroaniline). Among them UREA and d-LAP are suitable for nonlinear optical materials.

In the case of $\beta$-$BaB_2O_4$ single crystal, a laser ray of light is made incident on the XZ plane of the single crystal in such a manner that the direction of polarization of the laser ray of light is parallel with the Y direction of the crystal.

When a laser ray of light from a solid state laser is made incident on a nonlinear optical material, a second higher harmonic wave, a third higher harmonic wave, a fourth higher harmonic wave, that is n times higher harmonic wave (n is a natural integer) are generated together with a fundamental wave. A laser ray of light of a short wavelength can be obtained by splitting such higher harmonic waves using a prism, a beam splitter, and the like.

Usually, a third higher harmonic wave is more effectively generated by optical mixing between a fundamental wave and a second higher harmonic wave based on a second-order nonlinear optical effect, and this sun frequency mixing of two waves is utilized for generation of a third higher harmonic wave.

Here, a wavelength conversion characteristic is different, depending on the kind of nonlinear optical materials.

For example, with the materials $KTiOPO_4$, a ray of light of the wavelength 1064 nm output from a solid state laser is converted into a ray of light of the wavelength 532 nm.

With the material $\beta$-$BaB_2O_4$, a ray of light of the wavelength 1064 nm output from a solid state laser can be converted into a ray of light of the wavelength 212.8 nm by three $\beta$-$BaB_2O_4$ crystals.

The ray of light of the wavelength 1064 nm is converted into a ray of light of the wavelength 532 nm by the material $KTiOPO_4$ and further converted into a ray of light of the wavelength 266 nm by the material $\beta$-$BaB_2O_4$, and then furthermore can be converted into a ray of light of the wavelength 212.8 nm by the material $\beta$-$BaB_2O_4$.

The laser ray of light obtained as described above and converted into a ray of light of a short wavelength is employed, in the present intention, as a light source for lithography which is carried out in manufacturing of semiconductors. Since the wavelength of the laser ray of light obtained by the present invention is in the range of 160 to 1200 nm and preferably in the range of the short wavelength of 200 to 300 nm, more highly integrated semiconductors can be manufactured.

The provision of an integrator is suitable in the present invention. The distribution of the strength of the laser ray of light, which is obtained after the conversion of its wavelength using nonlinear optical materials, becomes uniform by the integrator. Consequently, a uniform ray of light having a uniform distribution of an illumination strength is obtained by the integrator. This ray of light becomes more optimum as a light source of a short wavelength for lithography.

Incidentally, there are available the lithography of a scan type wherein the upper surface of a semiconductor regist is scanned by a laser ray of light to draw semiconductor circuit patterns and that of a mask type wherein the upper surface of a semiconductor regist is exposed to a laser ray of light via a mask on which semiconductor circuit patterns are drawn. The present invention is applicable to the former type in the case where no integrator is used, and applied to the latter in the case where an integrator is used.

As described above, there can be obtained a solid state laser device for a light source of lithography in which the wavelength of the solid state laser ray of light is made as short as that of an excimer laser ray of light using a nonlinear optical material.

Hereinafter, an embodiment according to the present invention will be described with reference to FIG. 1.

In FIG. 1, reference numeral 1 shows a rear mirror (High Reflector), 2 a Q-switch, 3 an alexandrite rod, 4 a double refraction filter, 5 an etalon, 6 a fundamental wave of an alexandrite laser, 7 an output mirror (Output Coupler), 8 a first nonlinear optical crystal, 9 a second higher harmonic wave, 10 a wavelength plate, 1 a second nonlinear optical crystal, 12 a third higher harmonic wave, 13 a prism, and 14 an integrator.

The device according to this embodiment makes short the wavelength of a ray of light from a variable wavelength solid state laser using a material $\beta$-$BaB_2O_4$ and makes uniform the ray of light using an integrator. The variable wavelength solid state laser uses an alexandrite laser.

As shown in FIG. 1, the mirror 1, the Q-switch cell 2, the alexandrite rod (laser medium) 3, the double refraction filter (a wavelength tuning element) 4, the etalon (an element for making a wavelength to be in a narrow band) 5, and the output mirror 7 are arranged in a straight line to form a variable wavelength solid state laser (L), and a fundamental laser ray of light is output from the solid state laser (L).

The first nonlinear optical material ($\beta$-$BaB_2O_4$) 8, the wavelength plate 10, the second nonlinear optical material ($\beta$-$BaB_2O_4$) 11, and the prism 13 are arranged sequentially in a line on the output mirror side of the variable wavelength solid state laser (L), and further the integrator 14 is arranged near the prism 13. Here, the wavelength plate 10 is a parallel plane plate which is cut out of a crystal having double refraction. A wavelength plate providing a phase difference $\pi$ is called as a $\frac{1}{2}$ wavelength plate, and that providing a phase difference $2\pi$ is called as a one wavelength plate. Here a $\frac{1}{2}$ wavelength plate is employed.

Hereinafter, lithography processes using the device according to this embodiment will be described.

The alexandrite laser ray is provided with an oscillation wavelength tuned to 744 nm by the double refraction filter 4 disposed in the resonator (the rear mirror 1 and the output mirror 7) at its Brewster angle, and further its oscillation spectrum is made to be in a narrow band (below 0.005 nm) by the etalon 5 disposed on its optical axis. The laser ray (a fundamental wave) 6 obtained in this way penetrates the first nonlinear optical material ($\beta$-$BaB_2O_4$) 8, and the crystal concerned 8 converts one part of the ray of light of the fundamental wave into a ray of light of the second higher harmonic wave (372 nm) 9. Next, the fundamental wave 6 and the second higher harmonic wave 9 are made incident on the wavelength plate 10 to make their planes of polarization coincide with each other. The fundamental wave 6 and the second higher harmonic wave 9 of which planes of polarization are made to coincide with each other are made incident on the second nonlinear optical material ($\beta$-$BaB_2O_4$) 11. The second nonlinear optical material 11 mixes the fundamental wave 6 and the second higher harmonic wave 9 for generating the third higher harmonic wave (248 nm) 12.

The laser ray of light which penetrates the second nonlinear optical material 11 contains rays of light of wavelengths except the wavelength of the third higher harmonic wave 12, and the rays of light are split by the prism 13. The ray of light of the wavelength of the third higher harmonic wave 12 split by the prism 13 is made incident to the integrator 14 to make uniform the distribution of the strength of the ray of light.

What is claimed is:

1. A solid state laser device useful as a light source for lithography: comprising:
    a solid state laser emitting ray of light,
    a nonlinear optical material for converting a wavelength of the ray of light into a short wavelength in the range between about 200 nm and about 300 nm, and
    an integrator changing said ray of light having the short wavelength into an uniform ray of light useful as a light source for lithography.

2. The solid state laser device according to claim 1, wherein the solid state laser is a variable wavelength laser.

3. The solid state laser device according to claim 2, wherein the solid state laser is an alexandrite laser.

4. The solid state laser device according to claim 1, wherein the wavelength plate is a $\frac{1}{2}$ wavelength plate for providing the phase difference of $\pi$.

5. A solid state laser device useful as a light source for lithography according to claim 1, wherein
    said solid state laser comprises a rear mirror, a laser medium, a wavelength turning element, an element for converting a wavelength into a narrow band and an output mirror, all of which are arranged in a straight line, and
    said solid nonlinear optical material comprising a first nonlinear optical material and a second nonlinear material,
    said device further comprising a wavelength plate, and a wave selecting element;
    the first nonlinear optical material, the wavelength plate, the second nonlinear material, the wave selecting element and the integrator being arranged sequentially on the side of the output mirror or the solid state laser;
    the first nonlinear material converting one part of a fundamental wave emitting from the solid state laser into a second higher harmonic wave;
    the wavelength plate making the planes of polarization of the fundamental wave and the second higher harmonic wave coincide with each other;
    the second nonlinear material mixing the fundamental wave and the second higher harmonic wave for generating the third higher harmonic wave;
    the wave selecting element selecting only the third higher harmonic wave from the ray of light penetrating the second nonlinear optical material; and
    the integrator making uniform the distribution of the strength of the third harmonic wave.

6. A semiconductor lithography method characterized in that a laser ray of light output from a solid state laser is converted in wavelength into a laser ray of light of a short wavelength using a nonlinear optical material, and semiconductor circuit patterns are drawn by the laser ray of light of the short wavelength.

7. The semiconductor lithography method according to claim 6, wherein after a laser ray of light output from a solid state laser is converted in wavelength into a laser ray of light of a short wavelength using a nonlinear optical material, and the laser ray of light of the short wavelength is made uniform by an integrator, the exposure by the uniform laser ray of light is carried out via a mask on which semiconductor circuit patterns are drawn.

8. The semiconductor lithography method according to claim 6, wherein an oscillation wavelength of a laser ray of light output from a solid state laser is tuned to a special wavelength using a wavelength tuning element, an oscillation spectrum of the laser ray of light is made in a narrow band using a wavelength selection element, the fundamental wave of the laser ray of light obtained is made to penetrate a first nonlinear optical material, one part of the fundamental wave is converted into a second higher harmonic wave, the fundamental wave and the second higher harmonic wave are incident on a wavelength plate to make their planes of polarization coincide with each other, the fundamental wave and the second higher harmonic wave of which planes of polarization coincide with each other are made incident on a second nonlinear optical material, and the fundamental wave and the second higher harmonic wave are mixed using the second nonlinear optical material to generate a third higher harmonic wave, thereby carrying out the lithography using the laser ray of light of the third higher harmonic wave obtained.

9. The semiconductor lithography method according to claim 8, wherein the third higher harmonic wave obtained is made incident on the integrator to make uniform the distribution of the strength of the ray of light, and the exposure by the uniform ray of light is carried out via a mask on which semiconductor circuit patterns are drawn.

* * * * *